United States Patent
Gruhler

(10) Patent No.: US 9,689,733 B2
(45) Date of Patent: Jun. 27, 2017

(54) VIBRATION LIMIT SWITCH

(71) Applicant: VEGA Grieshaber KG, Wolfach (DE)

(72) Inventor: Holger Gruhler, Tuningen (DE)

(73) Assignee: VEGA GRIESHABER KG, Wolfach (DE)

( * ) Notice: Subject to any disclaimer, the term of this patent is extended or adjusted under 35 U.S.C. 154(b) by 454 days.

(21) Appl. No.: 14/190,998

(22) Filed: Feb. 26, 2014

(65) Prior Publication Data

US 2014/0333176 A1   Nov. 13, 2014

(30) Foreign Application Priority Data

May 8, 2013   (EP) ................ 13 167 026.7

(51) Int. Cl.
*H01L 41/04*   (2006.01)
*H02N 2/00*   (2006.01)
*G01F 23/296*   (2006.01)

(52) U.S. Cl.
CPC ...... *G01F 23/2968* (2013.01); *G01F 23/2967* (2013.01); *H01L 41/042* (2013.01); *H02N 2/001* (2013.01)

(58) Field of Classification Search
CPC . H01L 41/042; H01L 41/0825; H02N 2/0005; H02N 2/001; H02N 2/02; H02N 2/04; H02N 2/08

USPC ........................................................ 310/328
See application file for complete search history.

(56) References Cited

U.S. PATENT DOCUMENTS

| | | | |
|---|---|---|---|
| 4,594,584 A * | 6/1986 | Pfeiffer | G01F 23/2967 310/323.21 |
| 2002/0017833 A1* | 2/2002 | Montuschi | F02M 51/0603 310/328 |
| 2007/0096594 A1* | 5/2007 | Maruyama | G06F 3/011 310/317 |

FOREIGN PATENT DOCUMENTS

| | | |
|---|---|---|
| DE | 39 31 453 C1 | 2/1991 |
| DE | 198 40 211 C1 | 12/1999 |
| DE | 10 2006 016355 A1 | 10/2007 |
| EP | 2 209 110 A1 | 7/2010 |
| JP | S56 149900 A | 11/1981 |

* cited by examiner

*Primary Examiner* — Derek Rosenau
(74) *Attorney, Agent, or Firm* — Juneau & Mitchell

(57) ABSTRACT

A vibration limit switch with a membrane, which can be set into oscillation, and a drive unit for setting the membrane into oscillation and/or for detecting an oscillation of the membrane, with the drive unit comprising at least one electromagnetic drive and one Piezo-electric drive.

17 Claims, 3 Drawing Sheets

VIBRATION LIMIT SWITCH

CROSS REFERENCE TO RELATED APPLICATIONS

This patent application claims priority European Patent Application 13 167 026.7, filed on May 8, 2013.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention relates to a vibration limit switch.

Background of the Invention

The current state of knowledge is as follows.

Various vibration limit switches are known from prior art comprising a membrane, which can be set into oscillation, and a drive for setting said membrane into oscillation and/or for tapping said oscillation of a membrane, with either Piezo-electric elements or an electromagnetic drive being used. Such vibration limit switches are especially used for detecting fill levels and/or limits in containers for fluid or potentially fluid media, particularly liquids or bulk goods. Depending on the fill level in the container, the vibration limit switches are or are not in contact with the medium, so that the oscillation frequency of the membrane and/or oscillating elements arranged at said membrane are influenced by the contact with said medium.

It is considered disadvantageous in the vibration limit switches known from prior art that they show a limited range of application, depending on the drive used, particularly with regards to thermal and mechanic conditions.

The objective of the present invention is to provide a vibration limit switch that can be used over a wide range of applications.

BRIEF SUMMARY OF THE INVENTION

In a preferred embodiment, a vibration limit switch comprising a membrane, which can be set into oscillation, and a drive unit for setting the membrane into oscillation and/or for detecting an oscillation of the membrane, wherein the drive unit comprises at least one electromagnetic drive and a Piezo-electric drive.

In another preferred embodiment, the vibration limit switch as described herein, further comprising wherein an oscillating unit is arranged at the membrane.

In another preferred embodiment, the vibration limit switch as described herein, wherein the electromagnetic drive and the Piezo-electric drive are arranged such that optionally the electromagnetic drive and/or the Piezo-electric drive can be used for setting the membrane into oscillation.

In another preferred embodiment, the vibration limit switch as described herein, wherein the electromagnetic and the Piezo-electric drive are mechanically switched serially.

In another preferred embodiment, the vibration limit switch as described herein, wherein the Piezo-electric drive is arranged between the membrane and the electromagnetic drive.

In another preferred embodiment, the vibration limit switch as described herein, further comprising wherein a tension bolt is arranged at the membrane.

In another preferred embodiment, the vibration limit switch as described herein, wherein the electromagnetic drive acts upon the tension bolt at the rear.

In another preferred embodiment, the vibration limit switch as described herein, wherein the electromagnetic drive is connected fixed to the tension bolt, preferably screwed thereto.

In another preferred embodiment, the vibration limit switch as described herein, wherein the electromagnetic drive is screwed to the tension bolt such that it tightens the Piezo-electric drive against the membrane.

In another preferred embodiment, the vibration limit switch as described herein, wherein the tension bolt is embodied and arranged at least sectionally as a core of a coil of the electromagnetic drive.

In another preferred embodiment, the vibration limit switch as described herein, wherein the tension bolt is connected to a coil accept or a magnet accept of the electromagnetic drive.

In another preferred embodiment, the vibration limit switch as described herein, wherein the coil or magnet accept is embodied as a tension screw.

In another preferred embodiment, the vibration limit switch as described herein, wherein the Piezo-electric drive comprises a plurality of annularly embodied Piezo-elements, arranged in a stacked fashion.

In another preferred embodiment, the vibration limit switch as described herein, wherein the Piezo-electric drive comprises an annular Piezo-element, which is directly adhered to the membrane or with an adjustment ceramic being interposed.

In another preferred embodiment, a method for operating a vibration limit switch of one of the previous claims, comprising the following steps: (a) setting the membrane into vibration, and (b) detecting a resulting oscillation, optionally with an electromagnetic drive and/or a Piezo-electric drive being used for setting the membrane into oscillation and/or detecting the resulting oscillation.

In another preferred embodiment, the method as described herein, further comprising the step of: (c) selecting the drive to be used, depending on the viscosity and/or the temperature of a process medium.

In another preferred embodiment, the method as described herein, wherein one drive is used for setting the membrane into oscillation and the other drive for detecting the resulting oscillation.

DETAILED DESCRIPTION OF THE INVENTION

Figure 1:
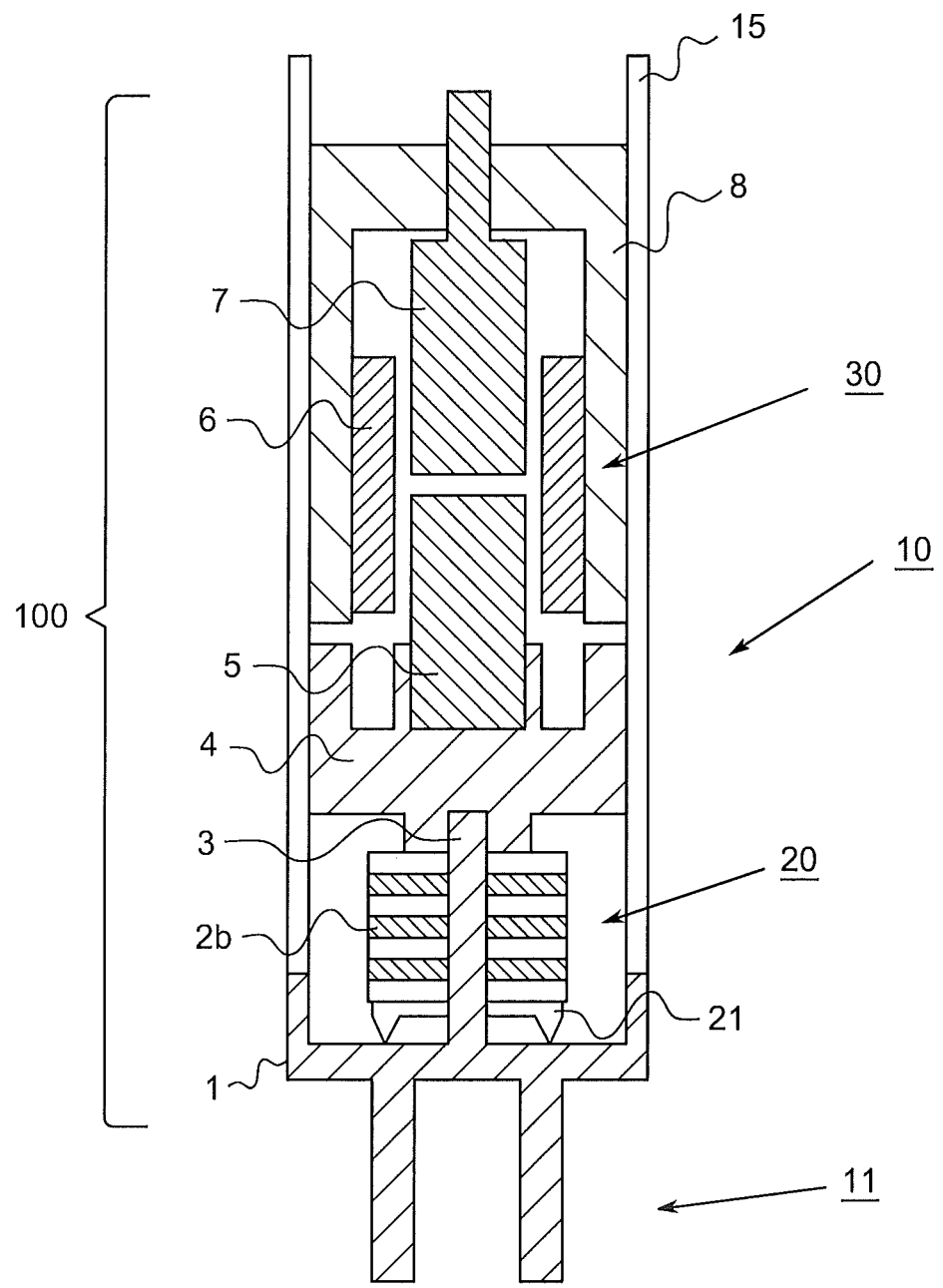
FIG. 1 is a line drawing evidencing a first exemplary embodiment of a vibration limit switch according to the invention.

The vibration limit switch according to the invention shows a membrane that can be set into oscillation, and a drive unit for setting said membrane into oscillation and/or for tapping an oscillation of the membrane, with the drive unit comprising at least one electromagnetic drive and one Piezo-electric drive.

By combining an electromagnetic drive and a Piezo-electric drive in a common drive unit, here a vibration limit switch is generated, which can be used over a wide range of temperatures and pressures.

Due to the fact that a Piezo-electric drive shows very good coupling between the drive and the membrane, which can be set into oscillation, this drive is well suited for highly viscous media, however, due to the low amplitude generated it is largely dependent on the pressure applied upon the membrane and/or an oscillating element arranged at the membrane, potentially causing the drive to fail, for example during the relaxation of a Piezo-stack used as the drive or e.g., a thermal change of the pre-stressing applied upon the Piezo-stack. Furthermore, a Piezo-electric drive is largely dependent on temperature, because the Piezo-electric effect considerably reduces at higher temperatures.

On the other hand, inductive drives show low coupling of the drive to the membrane, so that they are unsuitable for viscous media. Due to the fact that an inductive drive allows generating higher amplitudes, such a drive is subject to considerably less influence by pressures acting from the outside than to Piezo-electric drives so that, particularly since no mechanic pre-stressing of the drive is required, their use is also possible at higher pressures.

The positive features of the two above-mentioned drive variants can be connected to each other by an artful combination of an electromagnetic drive and a Piezo-electric drive such that particularly under certain scenarios of application the disadvantages of the respectively other drive are compensated and in this way a universally suitable vibration limit switch can be provided.

In particular, when measuring in the field of thixotropic media that show elevated fluidity under pressure, for example, in the range of normal pressure in which the media to be measured shows high viscosity, the Piezo-drive can be used for measuring a limit, while the inductive drive would not be functional in this situation. At increased pressure on a process pressure at which the medium to be measured shows reduced viscosity, then the inductive drive can be used, which is suitable for increased pressures, while the Piezo-electric drive no longer operates due to the effective pressure and a release of the Piezo-stack used as the drive.

A similar situation can occur when measuring media, whose viscosity changes under thermal influences. For media for which for example high viscosity is shown at room temperature, the Piezo-drive can be used in this situation, while the inductive drive is not suitable here due to the weak coupling between the drive and the membrane. At an elevated temperature, at which the medium shows a lower viscosity, the Piezo-drive is no longer optimally suited, due to the higher temperature, however, the inductive drive can be used here due to the reduced viscosity of the medium to be measured.

In a particularly beneficial embodiment of a vibration limit switch, an oscillating unit is arranged at the membrane, which may be embodied as an oscillating fork, for example. When such an oscillating unit is provided the vibration of the membrane is better transferred to the ambient medium, so that here a better detection of any damping of said oscillation is possible as well.

In a beneficial embodiment the electromagnetic drive and the Piezo-electric drive are arranged such that optionally the electromagnetic drive and/or the Piezo-electric drive can be used for setting the membrane into oscillation.

This way it is achieved that either the electromagnetic drive or the Piezo-electric drive, or optionally both drives, can be used for setting the membrane into oscillation. Here, the optimal drive and/or the optimal combination of drives can be selected for the presently given process parameters.

A particularly compact design is yielded when the electromagnetic drive and the Piezo-electric drive are mechanically switched serially.

Here it is particularly beneficial for the Piezo-electric drive to be arranged between the membrane and the electromagnetic drive. This way, the Piezo-electric drive can be coupled to the membrane of the vibration limit switch as directly and immediately as possible.

When a pre-stressed Piezo-stack is used as a Piezo-electric drive, and for the use of an electromagnetic drive, it is advantageous when a tension bolt is allocated to the membrane. Such a tension bolt may be used, on the one hand, for stressing a stack of Piezo-elements used as the drive in reference to the membrane and, on the other hand, for coupling the oscillation of the electromagnetic drive via the tension bolt to the membrane. The electromagnetic drive here acts particularly preferred at the rear upon the tension bolt and is preferably connected to it in a fixed manner, for example, screwed or welded thereto.

A particularly beneficial mechanic design can be achieved when the electromagnetic drive is screwed to the tension bolt such that it stresses the Piezo-electric drive in reference to said membrane. This way, an otherwise required tension device can be waived, for example, a tension screw for the Piezo-electric drive.

The electromagnetic drive may also be used for example to adjust the pre-stressing of the Piezo-electric drive to the process parameters given. For this purpose, a force upon the Piezo-drive can be generated in a static or dynamic fashion.

Alternatively, it is possible that the Piezo-electric drive is not embodied as a pre-stressed stack, but as a Piezo-element adhered to the membrane.

The tension bolt can additionally be embodied and arranged, at least sectionally, as a core of a coil of the electromagnetic drive. This way, by the use of a tension bolt as the core of a coil, a direct transmission of an oscillation generated in an electromagnetic drive can be achieved upon said tension bolt.

For this purpose, the tension bolt may be preferably connected fixed to a coil accept or a magnet accept of the electromagnetic drive, with the coil or magnet accept being preferably embodied as a tension screw for the Piezo-electric drive.

For this purpose, the Piezo-electric drive can be embodied here preferably as a plurality of annularly embodied Piezo-elements, arranged in a stacked fashion, which are arranged suitable to increase a generated amplitude.

Alternatively, the Piezo-electric drive may show an annular Piezo-element, which is adhered to the membrane such that no pre-tension of the Piezo-electric drive is necessary.

A method according to the invention for operating the above-described vibration limit switch shows the following steps:

Setting the membrane into oscillation

Detecting a resulting oscillation with optionally an electromagnetic drive and/or a Piezo-electric drive being provided to set the membrane into oscillation and/or detecting the resulting oscillation.

By an optional use of either the electromagnetic drive or the Piezo-electric drive, an increased thermal and mechanic range of application can be achieved for a vibration limit switch.

A selection of the drive to be used occurs preferably depending on a viscosity and/or a temperature of a processing medium, with preferably the Piezo-electric drive being selected at low temperatures and/or pressures and the inductive drive being selected at high pressures and/or temperatures. In one preferred embodiment of the method one drive is used for setting the membrane into oscillation and the other drive is used for detecting the resulting oscillation. This way, a redundancy of the drives can be generated.

DETAILED DESCRIPTION OF THE FIGURES

FIG. 1 shows a schematic illustration of a first exemplary embodiment of a vibration limit switch 10 according to the present application.

The vibration limit switch 10 shows a housing 15, embodied essentially in a tubular fashion. A drive unit 100 is supported in the housing 15, which in the present exemplary embodiment is formed from a frontal, i.e. facing a Piezo-electric drive 20 arranged at a membrane 1 and an electromagnetic drive 30 arranged at the rear. At the front, at the housing 15, a membrane 1 is arranged, which can be set into oscillation by the drives 20, 30, carrying an oscillation unit 11 embodied as an oscillation fork. At the interior of the housing, at the membrane 1, a tension bolt 3 is arranged, which is connected to the drives 20, 30 such that it can set the membrane 1 into oscillation. For this purpose the tension bolt 3 extends centrally in the direction of a longitudinal axis of the housing 15.

The Piezo-electric drive 20 is embodied in the first exemplary embodiment, shown in FIG. 1, as a stack of several Piezo-elements 2b, which are effectively connected via a pressure ring 21, arranged between the Piezo-stack and the membrane 1, to the membrane 1. The Piezo-elements 2b are embodied annularly and stacked such that upon a suitable excitation they perform an extension and/or contraction in the longitudinal direction of the tension bolt 3. The stack of Piezo-elements 2b is pre-stressed at the rear via a clamping nut 4, which rests on the tension bolt 3, in the direction of the membrane 1.

In the present exemplary embodiment the clamping nut 4 is embodied as a magnet accept of the electromagnetic drive 30, in which a permanent magnet 5 is accepted fixed. By the screw connection of the magnet accept 4 with the tension bolt 3, additionally an effective connection is generated between the electromagnetic drive 30 and the membrane 1. The electromagnetic drive 30 additionally shows a coil accept 8, embodied corresponding to the magnet accept, which is arranged fixed at the rear in a housing 15. On the one side, a core of a coil 7 is supported in the coil accept 8, which extends from the rear centrally in the direction of the permanent magnet 5 and on the other side a coil 6 is supported, which surrounds the core of the coil 7 and the permanent magnet 5. The core of the coil 7 and the permanent magnet 5 are embodied and arranged such that an air gap is formed between these components inside the coil, in which a magnetic field is active, induced by the coil 6. Another air gap is formed between the magnet accept 4 as well as the coil accept 8, embodied corresponding thereto, so that a magnetic field induced in the coil 6 acts overall upon the magnet accept 4, resulting in a force being applied upon the tension bolt 3.

Overall, the electromagnetic drive 3 can also be positioned in an opposite orientation in the housing 15. In this case, the coil accept 8 is connected to the tension bolt 3 and the magnet accept 4 is arranged fixed in the housing 15.

Figure 2:
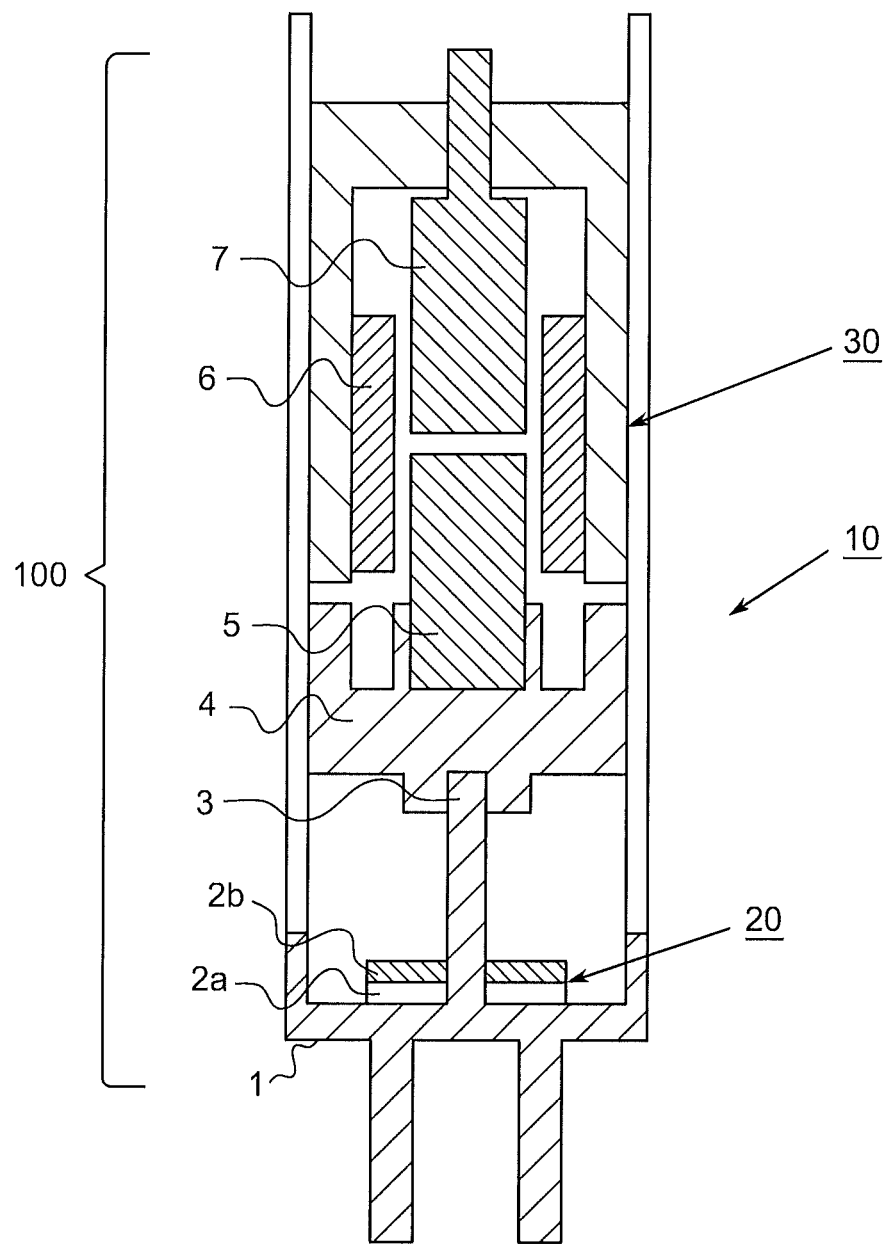
FIG. 2 is a line drawing evidencing a second exemplary embodiment of a vibration limit switch according to the invention.

FIG. 2 shows another exemplary embodiment of a vibration limit switch 10.

Unlike the vibration limit switch 10 of FIG. 1, in the present exemplary embodiment the Piezo-electric drive 20 is embodied with a single annularly embodied Piezo-element 2b, which is adhered via an adjustment ceramic 2a to the membrane 1. In the present exemplary embodiment the adjustment ceramic 2a serves for transferring the oscillation of the Piezo-element 2b as well as for adjusting the thermal extension coefficient of the membrane 1 and the Piezo-element 2b. As already described in reference to FIG. 1, the electromagnetic drive 30 is arranged at the rear in the housing 15 and is coupled via the magnet accept 4 to the tension bolt 3 such that an oscillation, generated by a magnetic field induced in the coil 6, is transferred to the membrane 1.

Due to the design of their drive unit 100 with two drives 20, 30 operating according to different principles, the above-described vibration limit switches 10 can be used under versatile operating and environmental conditions.

Here, for example, optionally only one of the drives 20, 30 can be used for setting the membrane 1 into oscillation as well as for detecting a resulting oscillation of said membrane 1. A selection of the drive 20, 30 to be used beneficially may occur here based on existing process parameters, for example, a processing temperature of a processing pressure and/or a viscosity of a processing medium to be measured, with the specific features of the drives 20, 30 used being considered.

The Piezo-electric drive 20 can here preferably be used for media with high viscosity, at normal pressures, as well as at temperatures below approx. 120-150° C. For media with lower viscosity, at high pressures, as well as temperatures above approx. 120-150° C. then preferably the electromagnetic drive 30 is used.

A potential scenario for use of a vibration limit switch 10 with a hybrid drive according to the present invention is given, for example, when monitoring the limit of heavy oil, which must be heated to a temperature of 60° C. in order to allow pumping it, and to more than 150° C. for combustion. Thus, an operation of the vibration limit switch 10 can be driven by the Piezo-electric drive 20 for the viscous heavy oil up to a temperature of approx. 120-150° C. The detection of a resulting oscillation of the membrane 1 can also occur via the Piezo-electric drive 20. Additionally, by the good mechanic coupling of the Piezo-electric drive 20 and the membrane 1, sufficiently strong oscillation of the membrane 1 can be induced even in highly-viscous media in order to allow detecting a limit. As soon as the temperature limit for using the Piezo-electric drive 20 has been exceeded, the Piezo-electric effect in the Piezo-elements 2b reduces such that no sufficient oscillation of the membrane 1 can be generated any more. Due to the fact that the heavy oil shows an accordingly lower viscosity based on the elevated temperature, now the use of the electromagnetic drive 30 is possible for setting the membrane 1 into oscillation as well as for detecting a resulting oscillation thereof, because in this situation the weaker mechanic coupling of the electromagnetic drive 30 to the membrane 1 is sufficient for generating a sufficiently large oscillation of the membrane 1.

Another exemplary application for a vibration limit switch 10 according to the present invention is given in a detection of the limit of thixotropic media, which under pressurization show elevated fluidity, i.e. a lower viscosity.

At normal pressure, at which these media show increased viscosity, preferably the Piezo-electric drive 20 is used for exciting an oscillation of the membrane 1 as well as the oscillation fork 11. By the strong mechanic coupling between the Piezo-electric drive 20 and the membrane 1, here a sufficiently strong oscillation can be generated. With increasing processing pressure, which may lead to a release of the Piezo-stack in a vibration limit switch 10 according to FIG. 1, here a reduced functionality of the Piezo-electric drive 20 is caused, so that preferably the electromagnetic drive 30 is used for generating and detecting the oscillation. Based on the lower viscosity of the thixotropic media at elevated pressures in the exemplary application the electromagnetic drive 30 is then also suitable to generate sufficiently large oscillation of the membrane 1 for detecting limits.

A selection of the drive used for generating oscillations can occur here particularly based on additionally determined process parameters, such as the processing temperature, the viscosity of the processing medium to be measured, and the processing pressure.

Figure 3:
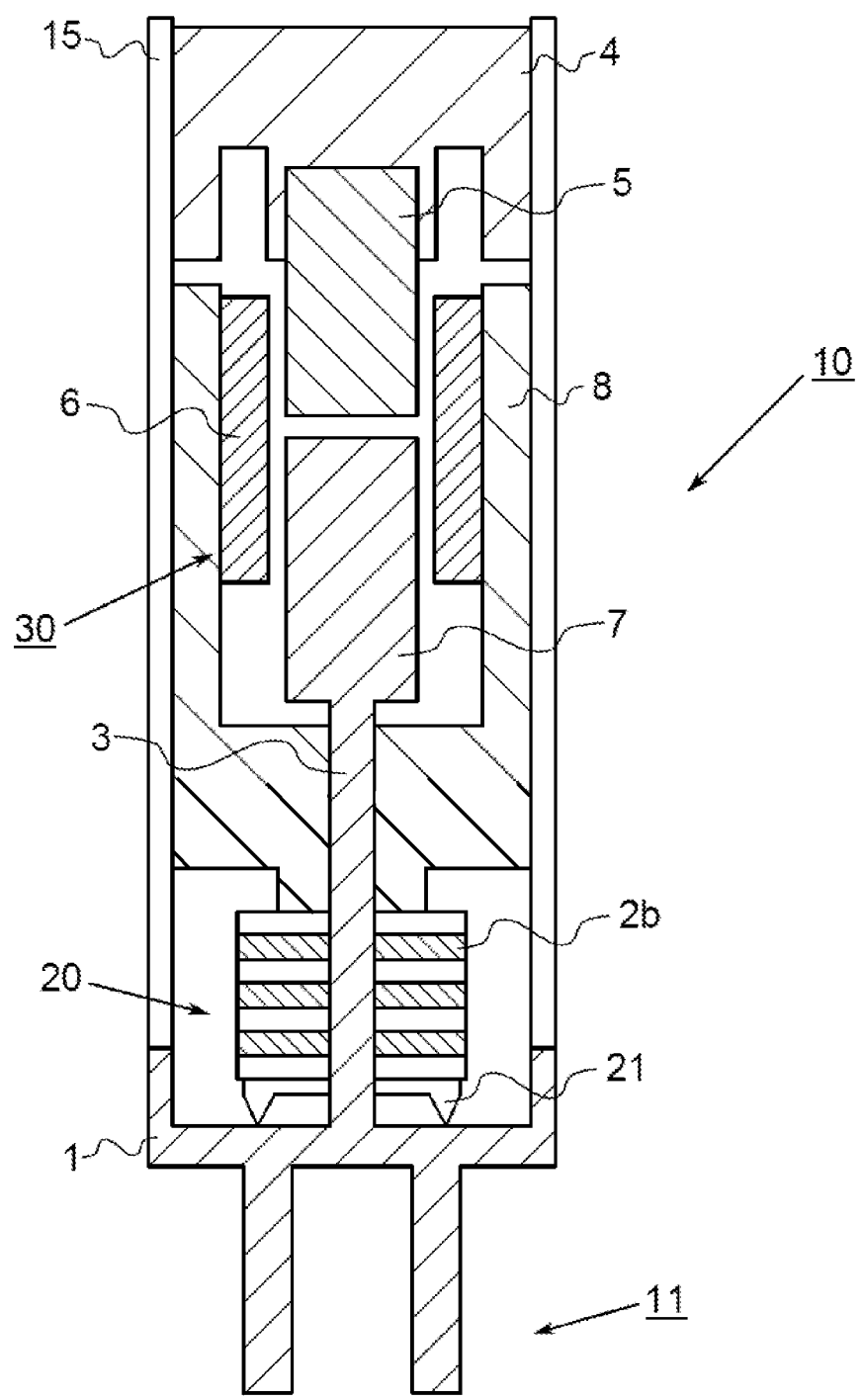
FIG. 3 is a line drawing evidencing another exemplary embodiment of a vibration limit switch according to FIG. 1.

FIG. 3 shows another exemplary embodiment of a vibration limit switch 10, in which the electromagnetic drive 3 can also be positioned in an opposite orientation in the housing 15, so that the coil support 8 is connected to the tension bolt 3 and the magnet support 4 is arranged fixed in the housing 15. Thus, the tension bolt 3 is illustrated as being arranged as a core of a coil of the electromagnetic drive 30.

LIST OF REFERENCE NUMBERS

1 Membrane
3 Tension bolt
4 Magnet accept/clamping nut
5 Permanent magnet
6 Coil
7 Core of the coil
8 Coil accept
10 Vibration limit switch
11 Oscillating unit/oscillating fork
15 Housing
20 Piezo-electric drive
21 Pressure ring
30 Electromagnetic drive
100 Drive unit
2a Adjustment ceramic
2b Piezo-element The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable Equivalents.

I claim:

1. A vibration limit switch comprising a membrane, which can be set into oscillation, and a drive unit for setting the membrane into oscillation and for detecting an oscillation of the membrane, wherein the drive unit comprises at least one electromagnetic drive and a Piezo-electric drive, wherein the electromagnetic drive and the Piezo-electric drive are arranged such that the electromagnetic drive or the Piezo-electric drive can set the membrane into oscillation, wherein the electromagnetic drive is screwed to a tension bolt such that the tension bolt tightens the Piezo-electric drive against the membrane.

2. The vibration limit switch of claim 1, further comprising wherein an oscillating unit is arranged at the membrane.

3. The vibration limit switch of claim 1, wherein the electromagnetic and the Piezo-electric drive are arranged serially.

4. The vibration limit switch of claim 1, wherein the Piezo-electric drive is arranged between the membrane and the electromagnetic drive.

5. The vibration limit switch of claim 4, further comprising wherein a tension bolt is arranged at the membrane.

6. The vibration limit switch of claim 5, wherein the electromagnetic drive acts upon the tension bolt at the side which is averted from the membrane.

7. The vibration limit switch of claim 6, wherein the electromagnetic drive is connected fixed to the tension bolt.

8. The vibration limit switch of claim 5, wherein the tension bolt is embodied and arranged as a core of a coil of the electromagnetic drive.

9. The vibration limit switch of claim 5, wherein the tension bolt is connected to a coil support or a magnet support of the electromagnetic drive.

10. The vibration limit switch of claim 9, wherein the coil or magnet support is embodied as a tension screw.

11. The vibration limit switch of claim 1, wherein the Piezo-electric drive comprises a plurality of annularly embodied Piezo-elements arranged in a stacked fashion.

12. The vibration limit switch of claim 1, wherein the Piezo-electric drive comprises an annular Piezo-element directly adhered to the membrane or with an adjustment ceramic being interposed.

13. A method for operating a vibration limit switch of one of the previous claims, comprising the following steps:
    (a) setting the membrane into vibration, and
    (b) detecting a resulting oscillation, alternately using an electromagnetic drive or a Piezo-electric drive for setting the membrane into oscillation and detecting the resulting oscillation.

14. The method of claim 13, further comprising the step of:
    (c) selecting the drive to be used, depending on the viscosity or the temperature of a process medium.

15. The method of claim 13, wherein one drive is used for setting the membrane into oscillation and the other drive for detecting the resulting oscillation.

16. The vibration limit switch of claim 7, wherein the electromagnetic drive is screwed to the tension bolt.

17. The vibration limit switch of claim 1, wherein the electromagnetic drive and the Piezo-electric drive are arranged such that the electromagnetic drive and the Piezo-electric drive together can set the membrane into oscillation.

* * * * *